United States Patent
Bulovic et al.

(10) Patent No.: US 9,195,004 B2
(45) Date of Patent: Nov. 24, 2015

(54) METHOD AND APPARATUS FOR FORMING STRUCTURES OF POLYMER NANOBEADS

(75) Inventors: Vladimir Bulovic, Lexington, MA (US); Murali Chaparala, Newton, MA (US); Jianglong Chen, San Jose, CA (US); Eric Wing-Jing Lam, Kenmore, WA (US); Valerie Leblanc, San Carlos, CA (US); Martin A. Schmidt, Reading, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 1377 days.

(21) Appl. No.: 12/746,044

(22) PCT Filed: Jan. 5, 2009

(86) PCT No.: PCT/US2009/030151
§ 371 (c)(1),
(2), (4) Date: May 10, 2011

(87) PCT Pub. No.: WO2009/120394
PCT Pub. Date: Oct. 1, 2009

(65) Prior Publication Data
US 2011/0206839 A1    Aug. 25, 2011

Related U.S. Application Data

(60) Provisional application No. 61/019,176, filed on Jan. 4, 2008.

(51) Int. Cl.
*G02B 6/138* (2006.01)
*B05D 3/10* (2006.01)
(Continued)

(52) U.S. Cl.
CPC *G02B 6/138* (2013.01); *B05D 3/04* (2013.01); *B05D 3/0453* (2013.01); *B05D 3/107* (2013.01); *G02B 2006/12071* (2013.01); *G03F 7/168* (2013.01)

(58) Field of Classification Search
CPC ........ B05D 3/04; B05D 3/0453; B05D 3/107; G03F 7/168
See application file for complete search history.

(56) References Cited

U.S. PATENT DOCUMENTS 4,266,263 A    5/1981    Haberl et al.
6,160,828 A    12/2000    Kozlov et al.
(Continued)

FOREIGN PATENT DOCUMENTS

DE    10 2007-1699    10/2008
WO    WO 03-073164    9/2003
(Continued)

OTHER PUBLICATIONS

Arda et al., Vapor-induced film formation from low-Tg particles for different solvent compositions; J. Coll. & Inter. Sci. 297, 2006, 520-524.*

(Continued)

*Primary Examiner* — James M Mellott
(74) *Attorney, Agent, or Firm* — Dianoosh Salehi (57) ABSTRACT

The disclosure relates to providing printed structures of polymer that have substantially flat printed surfaces. In one embodiment, the disclosure relates to a post-printing treatment apparatus for receiving a substrate supporting a polymer printing thereon. The polymer can be PMMA or other suitable polymer. In a related embodiment, the polymer defines a thermoplastic polymer having a glass transition temperature. The apparatus can comprise of a chamber, and input manifold, an exhaust manifold, a solvent reservoir and a gas reservoir. The solvent reservoir provides one or more solvent systems adapted to chemically bind, and potentially react, with the polymer. The gas reservoir provides one or more gases for drying the substrate and printed polymer after the solvent treatment step. In one application, a substrate having printed surface thereon is placed in the chamber and exposed to the solvent system for sufficient period of time to provide substantially flat print surfaces.

12 Claims, 8 Drawing Sheets (51) Int. Cl.
*B05D 3/04* (2006.01)
*G03F 7/16* (2006.01)
*G02B 6/12* (2006.01)

(56) References Cited

U.S. PATENT DOCUMENTS

| | | |
|---|---|---|
| 6,294,398 B1 | 9/2001 | Kim et al. |
| 6,312,971 B1 * | 11/2001 | Amundson et al. ............. 438/99 |
| 6,444,400 B1 | 9/2002 | Cloots et al. |
| 6,472,962 B1 | 10/2002 | Guo et al. |
| 6,498,802 B1 | 12/2002 | Chu et al. |
| 6,586,763 B2 | 7/2003 | Marks et al. |
| 7,346,981 B2 | 3/2008 | Borwick et al. |
| 7,406,761 B2 | 8/2008 | Jafri et al. |
| 7,836,574 B2 | 11/2010 | Jafri et al. |
| 2004/0004988 A1 | 1/2004 | Cok et al. |
| 2004/0234748 A1 * | 11/2004 | Stenzel ................... A61L 31/10 428/327 |
| 2005/0285102 A1 * | 12/2005 | Koo et al. ........................ 257/40 |
| 2006/0048885 A1 | 3/2006 | Constantin |
| 2007/0071881 A1 * | 3/2007 | Chua et al. ....................... 427/58 |
| 2010/0288635 A1 | 11/2010 | Komiya et al. |

FOREIGN PATENT DOCUMENTS

| | | |
|---|---|---|
| WO | WO 2004-107403 | 12/2004 |
| WO | WO 2008/133942 | 11/2008 |
| WO | WO 2009/096419 | 8/2009 |

OTHER PUBLICATIONS

International Search Report dated Jun. 16, 2011 for Application No. PCT/US2010/052403.
Hanseup Kim et al., "Characterization of Aligned Wafer-Level Transfer of Thing and Flexible Parlene Membranes", *Journal of Microelectromechanical Systems*, Dec. 1, 2007, vol. 16, No. 6, pp. 1386-1396.
Meitl et al., "Transfer Printing by Kinetic Control of Adhesion to an Elastometric Stamp," *Nature Materials Nature Publishing Group UK*, vol. 5, No. 1, Jan. 2006, pp. 33-38.
International Preliminary Report on Patentability issued on Oct. 6, 2009 for PCT Application No. PCT/US09/030151.
International Preliminary Report on Patentability issued on Feb. 8, 2011 for PCT Application No. PCT/US09/053086.
International Search Report and Written Opinion dated Mar. 29, 2010 issued for PCT Application No. PCT/US2009/056267.
International Search Report and Written Opinion dated Dec. 10, 2010 issued for PCT Application No. PCT/US2009/067801.

* cited by examiner

| Step | Description |
|---|---|
| Starting material | Glass slide |
| 1 Cleaning | Sonicate in Micro-90 (detergent) for 5 minutes, DI water rinse, dry by dipping in boiling IPA |
| 2 Deposition | Print PMMA sacrificial layer: 6 layers with $d$=120μm pitch on 40°C substrate |
| 3 Smoothing | Pre- & post-bakes 5 minutes on 100°C hotplate, 8 minutes in acetone vapors |
| 4 Deposition | Print PMMA barriers: 20 layers with 25μm pitch on 40°C substrate |
| 5 Smoothing | Pre- & post-bakes 5 minutes on 100°C hotplate, 3 minutes in acetone vapors |
| 6 Deposition | Print silver structural layer: 15 layers with $d$=80μm pitch on 60°C substrate |
| 7 Sintering | 30 minutes at 250°C in nitrogen environment with 1.5°C/minute ramp up and down |
| 8 Trim | Laser trim devices |
| 9 Releasing | Wet-etch PMMA in chloroform for 15 minutes |
| 10 Rinsing | Rinse samples in chloroform for 10 & 5 minutes, dry with $N_2$ |

*FIG. 7*

METHOD AND APPARATUS FOR FORMING STRUCTURES OF POLYMER NANOBEADS

This invention was made with government support. Accordingly, the government has certain rights in this invention.

BACKGROUND

1. Field of the Invention

The disclosure relates to printing structures made of polymer nanobeads. More specifically, the disclosure relates to a method and apparatus for providing printed structures of polymer nanobeads that have substantially flat printed surfaces and provide improved optical properties.

2. Description of Related Art

Microelectromechanical systems (MEMS) fabrication falls into two categories: bulk and surface micromachining. The former consists of removing significant portions of the underlying substrate to define the desired features, while the latter consists of addition and subsequent removal of materials on top of the base substrate. Both categories rely on semiconductor industry manufacturing methods, especially lithography, a technique which relies on mask layers to selectively protect the covered portions while etching the exposed regions. The price of MEMS remains significantly larger than its semiconductor counterparts. The semiconductor model is based on everything using standardized processes and packaging to outweigh and spread the large overhead cost over many diverse products. MEMS typically require specialized processes and packaging for each product and cannot recover the large overhead costs without being significantly more expensive. As such, novel fabrication techniques need to be explored to lower the price of MEMS devices.

There has been a significant effort in lowering the cost of MEMS, from investigating low-cost materials to highly efficient fabrication processes. One category is the development of tools and techniques that would eliminate the need for standard photolithography tools. Inkjet is an alternative to standard lithography processes and can be used in a drop-on-demand ("DOD") fashion to deposit multiple small droplets of desired materials at digitally-defined positions. These defined positions can pattern features for several purposes, including integrated circuits and MEMS devices. The maskless concept has several advantages including less material waste, fewer design-to-fabrication delays, and faster fabrication.

Poly(methyl methacrylate) (PMMA) or poly(methyl 2-methylpropenoate) is a thermoplastic material with transparent color. PMMA is the synthetic polymer of methyl methacrylate. PMMA's common names include acrylic glass, acrylic or Plexiglas. Acrylic, or acrylic fiber, can also refer to polymers or copolymers containing polyacrylonitrile. PMMA has been used as an alternative to glass and in competition with polycarbonate (PC) plastic. PMMA is often preferred over PC because of its moderate properties, easy handling and processing, and low cost. PMMA is more brittle than PC (but less brittle than glass) when loaded or when under an impact force. PMMA is conventionally produced by emulsion polymerization, solution polymerization and bulk polymerization.

PMMA polymers with unique optical and thermoplastic characteristics have been used as waveguide materials in optoelectronic devices or as sacrificial spacer layers in micro-electro-mechanical systems (MEMS) where smooth surface morphology is essential. Although simple methods of depositing PMMA films from solution have already existed, including for example, spin coating, dip coating or spray coating, lithographic techniques are most commonly applied. However, lithographic techniques are expensive and time-consuming. A fast, low-cost, patterning technique such as inkjet printing would be of great interest for the preparation of planar PMMA features over large area.

Inkjet printing technology has already been adopted to deposit a variety of polymer inks for digital fabrication ("DigiFab") applications. Non-uniform polymer patterns are often observed as a result of inkjet printing. The non-uniform patterns have been attributed to the complicated ink wetting and drying process on ink-impermeable substrate surface.

To improve the surface morphology of the printed PMMA films, research efforts have focused on ink formulation or surface treatment. For example, conventional ink formulations have been devised by mixing volatile and slow-drying solvents as the ink vehicle (or carrier). Other conventional approaches have modified the substrate surface to have ink-attracting/repelling regions so as to engineer surface tension. The conventional approaches have failed to produce a substantially flat printed PMMA surface suitable for high-tech applications. The PMMA layer produced with conventional method also lacks the desired optical properties. Therefore, there is a need for a method and apparatus for constructing polymer structures with improved morphological and optical properties.

SUMMARY

In one embodiment, the disclosure relates to a method and apparatus for providing substantially flat printing surface of a PMMA ink (or other similar polymer inks) by subjecting the polymer print face to post-treatment processes. In accordance with the embodiment, a post-treatment process is devised by determining the polymer's thermoplastic properties, including the polymer's glass transition temperature, identifying a solvent system compatible with the polymer, and exposing the printed polymer to the solvent system for such duration as to permit the polymer to reach, at least partially, its glass transition temperature.

In another embodiment, the disclosure relates to identifying the polymer's thermoplastic properties to substantially eliminate the surface roughness of printed polymer. In accordance with the embodiment, inkjet printing method is used to deposit printed polymer on a substrate. The substrate having printed polymer thereon is exposed to one or more solvents for a duration of time necessary to subject the print surface of the polymer to render a smooth and substantially flat surface.

In still another embodiment, the disclosure relates to a method and apparatus for providing a sacrificial polymer layer for a MEMS device. Here, a polymer film is formed using inkjet printing techniques. The deposited polymeric film is defined by rough surface morphology as the polymer nanobeads forming the polymer film are inefficiently packed. Prior to depositing the structural layers, the polymer film is treated to provide a more densely packed polymer layer. In one embodiment, the morphology of the print surface changes during the densification process; however, the footprint (i.e., the surface area covered by the print) remains constant during the process. In other words, the thickness of the film shrinks as the ink penetrates (or packs) closer to the substrate surface during the densification process.

In still another embodiment, the disclosure relates to a post-printing treatment apparatus for receiving a substrate supporting a polymer printing thereon. The polymer can be PMMA or other suitable polymer. In a related embodiment, the polymer defines a thermoplastic polymer having a glass transition temperature. The apparatus can comprise of a chamber, and input manifold, an exhaust manifold, a solvent reservoir and a gas reservoir. The solvent reservoir provides one or more solvent systems, in the form of a vapor, to the chamber. The solvent system can be adapted to chemically bind, and potentially react, with the polymer to lower the glass transition temperature of the polymer. The gas reservoir provides one or more gases for drying the substrate and printed polymer after the solvent-vapor treatment step. In one application, a substrate having printed surface thereon is placed in the chamber and exposed to the solvent system. After sufficient exposure, the exhaust solvent gases are removed from the chamber and the substrate and the printed polymer are dried using drying gases from the reservoir.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

The disclosure relates to a method and apparatus for providing printed structures of polymer films that have substantially flat printed surfaces and provide improved optical properties. A typical polymer film is made of polymer nanobeads. When deposited with an inkjet print-head, the nanobeads pack together to form a printed polymer layer. The polymer nanobeads are transported through the inkjet print-head in a carrier fluid. The conventional carrier fluid is a solvent which, after deposition on the substrate, evaporates.

After the carrier fluid has evaporated, a group of polymer nanobeads are left behind on the substrate. The morphological and optical properties of the deposited film show a loosely packed structure where adjacent polymer nanobeads have some spatial distance therebetween. The resulting structure has a choppy surface unsuited for receiving and supporting a subsequent layer. The resulting structure is also an opaque polymer layer with poor optical transparency. Hence, the polymer film is not suited for application as a sacrificial layer nor as an optically transparent film.

Ink comprising polymer nanobeads can effectively decouple the ink concentration and the ink viscosity. Adding more polymer nanobeads into a carrier fluid does not necessarily affect its viscosity while adding more polymer solutes into a carrier fluid will be more likely to increase its viscosity and cause difficulty for inkjet printing of the polymer. This is especially true when the polymer loading concentration is high. Thus, it can be preferable to select a nanobead-carrier-fluid system over a regular solute-solvent system.

The conventional approach for addressing this deficiency has concentrated on annealing the polymer film. However, the polymer film is often used in building a large area printed electronic ("LAPE") circuits which does not fit in a typical convection oven. The LAPE also contains more than just the polymer film and heating can damage the non-polymer films.

To address these and other deficiencies, an embodiment of the invention improves the nanobead's packing by reflowing the polymer at room temperature and pressure. The reflowing process enables the nanobeads to fill the spaces therebetween. The polymers then fuse to each other to form a smooth film surface suitable for supporting other layers. The polymer film also becomes optically transparent relative to its initial state and can be used for optical applications. In accordance to one embodiment of the disclosure, the glass temperature of the polymer system is lowered to about the room temperature or lower in order to avoid heating the substrate and/or the polymer film. In one embodiment, the polymer system comprises a mixture of the polymer beads and the annealing solvent vapor. This can be implemented by introducing vaporized solvents which act as plasticizers and lower the PMMA's $T_g$ such that PMMA reflows at room temperature.

The solvent vapor annealing effect can be described based on the free volume theory to induce glass transition in organic films. This effect can also be applied in growing organic crystals from amorphous organic films and room temperature imprint lithography. A semi-empirical equation to estimate the glass transition temperature is shown as:

$$T_g \approx \frac{T_{go}}{1 + \left(\frac{T_{go}}{T_{gs}} - 1\right)\Phi_s} \quad (1)$$

$$T_{gs} \approx \frac{2}{3}T_{ms} \quad (2)$$

Where, $T_g$ denotes glass transition temperature, $T_{go}$ and $T_{gs}$ are the glass transition temperatures for the polymer film and pure solvent, i.e., PMMA and toluene, respectively, and $T_{ms}$ is the melting point of pure toluene ($T_{ms}$~180K) and can be used for estimating toluene's glass transition temperature, $T_{gs}$ ($T_{gs}$~120K). In the equations, $\Phi_s$ is the volumetric fraction of toluene in PMMA. The critical solvent volumetric fraction ($\Phi_{ms}$) has been defined as the uptake value of toluene in PMMA to lower $T_g$ to room temperature. For PMMA ($T_{go}$=378 K) and toluene system, the calculated $\Phi_{s,crit}$ is about 18%, an indication of high solubility of toluene in PMMA. $\Phi_{s,crit}$ is the lowest amount of toluene in PMMA that would allow the desirable shift in the glass transition temperature of the PMMA system to below room temperature. Increasing the $\Phi_s$ would decrease the PMMA system's glass transition temperature.

When the toluene uptake exceeds the critical volume fraction, thermoplastic PMMA film begins to soften and deform easily, resulting in smooth surface morphology.

Polymer Film Treatment

Figure 1A:
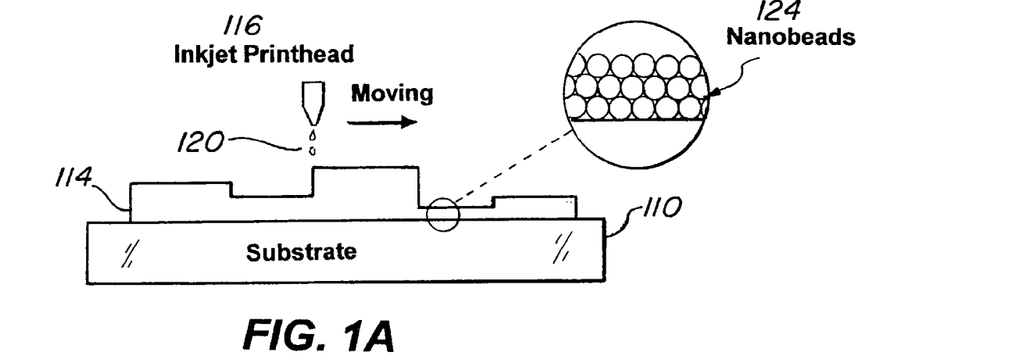
FIG. 1A is a schematic representation of conventional inkjet printing on a substrate.

FIG. 1A is a schematic representation of conventional ink-jet printing on a substrate. In the exemplary representation of FIG. 1A, print head 116 is moving with respect to substrate 110. Print head 116 deposits droplets 120. Droplets 120 generally include a pigment which is dissolved or suspended in a carrier fluid. In one embodiment of the invention, the pigments comprise one or more polymer system. The polymer can be PMMA.

Printed polymer film 114 is deposited on substrate 110 according to a pre-defined pattern and configuration. Polymer film 114 includes polymer nanobeads 124. For simplicity, nanobeads 124 are illustrated as circles. Prior to deposition, the nanobeads are suspended as pigment in the carrier fluid. Upon deposition, the carrier fluid evaporates, leaving the polymer nanobeads as the printed polymer layer. Depending on external factors, the printed polymer layer can provide loosely packed or densely packed layer of nanobeads. The packing density is a function of several factors, including the type and amount of carrier fluid and the evaporation rate. As will be shown in greater detail, the packing arrangement of the nanobeads defines the optical property of the printed polymer film 114. In the exemplary embodiment of FIG. 1A, the nanobeads show adjacent circles to represent individual polymer nanobeads with unoccupied space therebetween. The causes of thickness non-uniformity include pinning of drop contact line, capillary outflow of beads towards the edge and impingement of drops on existing layers of the substrate.

Figure 1B:
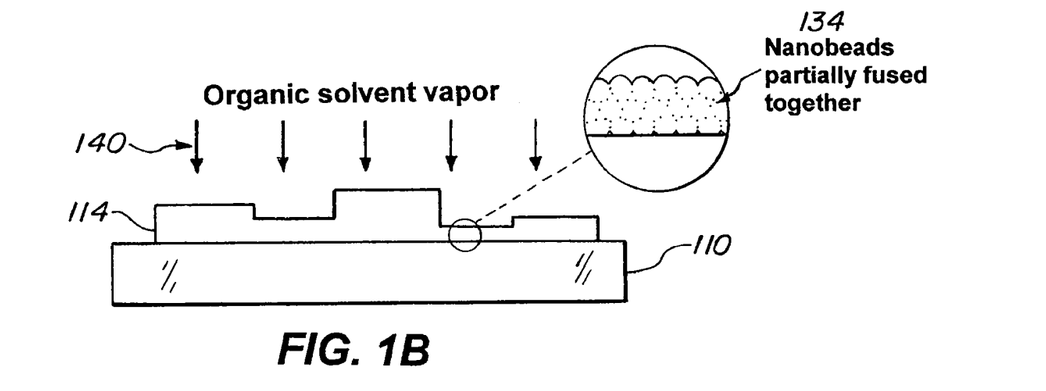
FIG. 1B schematically illustrates partial fusion of the nanobeads of FIG. 1A according to one embodiment of the invention.

FIG. 1B schematically illustrates partial fusion of the nanobeads of FIG. 1A according to one embodiment of the invention. In FIG. 1B, the printed polymer film of FIG. 1A is subjected to organic solvent vapor treatment. Specifically, organic solvent vapor 140 is exposed to printed polymer film 114. As shown in the expanded portion of FIG. 1B, the polymer nanobeads start to fuse to each other thereby removing interface between nanobeads 124 shown in FIG. 1A. The fusion process (interchangeably, the reflow process) is a result of the exposure of the polymer nanobeads 134 to solvent vapor 140. As the polymers come in contact and absorb the solvent vapor, the polymer's glass transition temperature (Tg) is lowered. As the Tg is lowered, the polymer beads begin to reflow and fuse to each other. The reflowing of the polymer takes place at room temperature and without heating the polymer and/or the substrate.

As seen in FIG. 1B, the surface smoothness of printed polymer film 114 has improved as compared with FIG. 1A. According to one embodiment of the invention, the printed surface area of polymer 114 remains substantially identical from when the film is deposited until the solvent vapor treatment is completed. In one embodiment, the printed feature will shrink in the vertical direction (thickness) while the footprint (the lateral dimension) will remain constant.

Figure 1C:
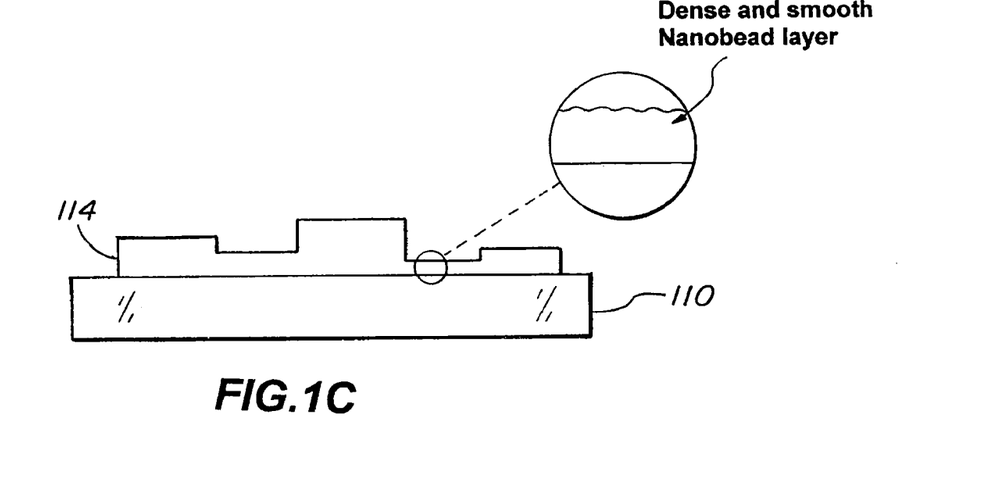
FIG. 1C shows substrate 110 and printed polymer film 114 after sufficient exposure to the organic solvent vapor.

FIG. 1C shows substrate 110 and printed polymer film 114 after sufficient exposure to the organic solvent vapor. As shown, the polymer nanobeads have completed the reflow process and are now fused to each other. The bead interface is no longer visible. Instead, the polymer has relatively clear film 144. The surface of printed polymer film 114 is now smooth and printed polymer film 114 is substantially less opaque than in FIG. 1A. Importantly, the process did not require annealing and the final printed surface is substantially identical footprint to the initially printed surface.

Figure 2A:
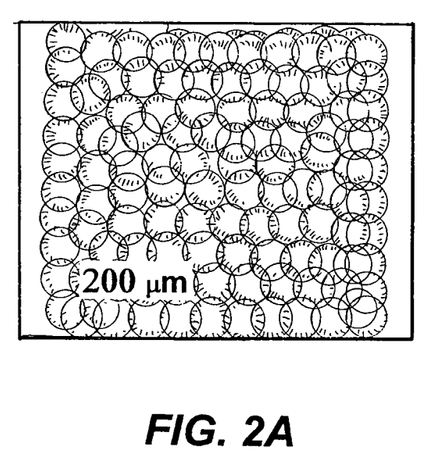
FIG. 2A-2D shows microscopic photographs of the printed polymer film throughout treatment with organic solvent vapor.
Figure 2B:
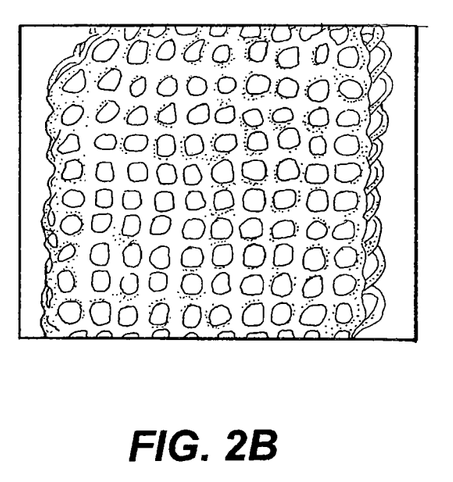
Figure 2C:
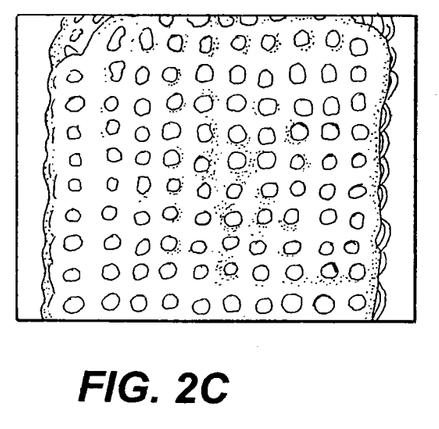
Figure 2D:
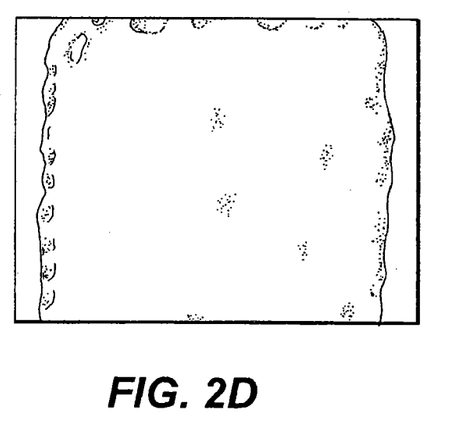

FIG. 2A-2D shows microscopic pictures of the printed polymer film throughout treatment with organic solvent vapor. Here, printed PMMA films were deposited over a slide glass and suspended over a pool of acetone to expose them to acetone vapors. FIG. 2A shows the printed polymer film (114, FIG. 1A) upon deposition by ink-jet printing. The structure of FIG. 2A is opaque and does not transmit light as the so-called coffee-ring structures are overlapping and the nanobeads are loosely packed. The polymer film 2B is taken after about 5 minutes of exposure to acetone vapor. It can be seen in FIG. 2B that the coffee-ring appearance of the nanobeads is beginning to flow. The circles in FIG. 1A represent nanobeads and the circles in FIG. 2A denote individual nanobeads. Because the coffee-rings are overlapped at the edges, the entire feature has a waffle-type appearance where the bright color area shows the ring-like structure and the dark color area is the recess area. Also, because the loosely packed nanobeads are in the overlapping coffee-ring shape, the structure is still not uniform or smooth. FIG. 2C is the microscopic picture of the printed polymer film after about 10 minutes of exposure to the organic solvent vapor of acetone. As seen, the polymer beads have begun reflowing and fusing to each other. The transparency has improved over FIG. 2B. Finally, FIG. 2D shows the structure after it has been exposed to the organic solvent vapor treatment for about 20 minutes. The film of FIG. 2D is smooth and transparent relative to the film of FIG. 2A. It is clear from FIGS. 2A-2D that the post deposition treatment with solvent vapor is effective in increasing the polymer's optical properties and surface smoothness.

Figure 3:
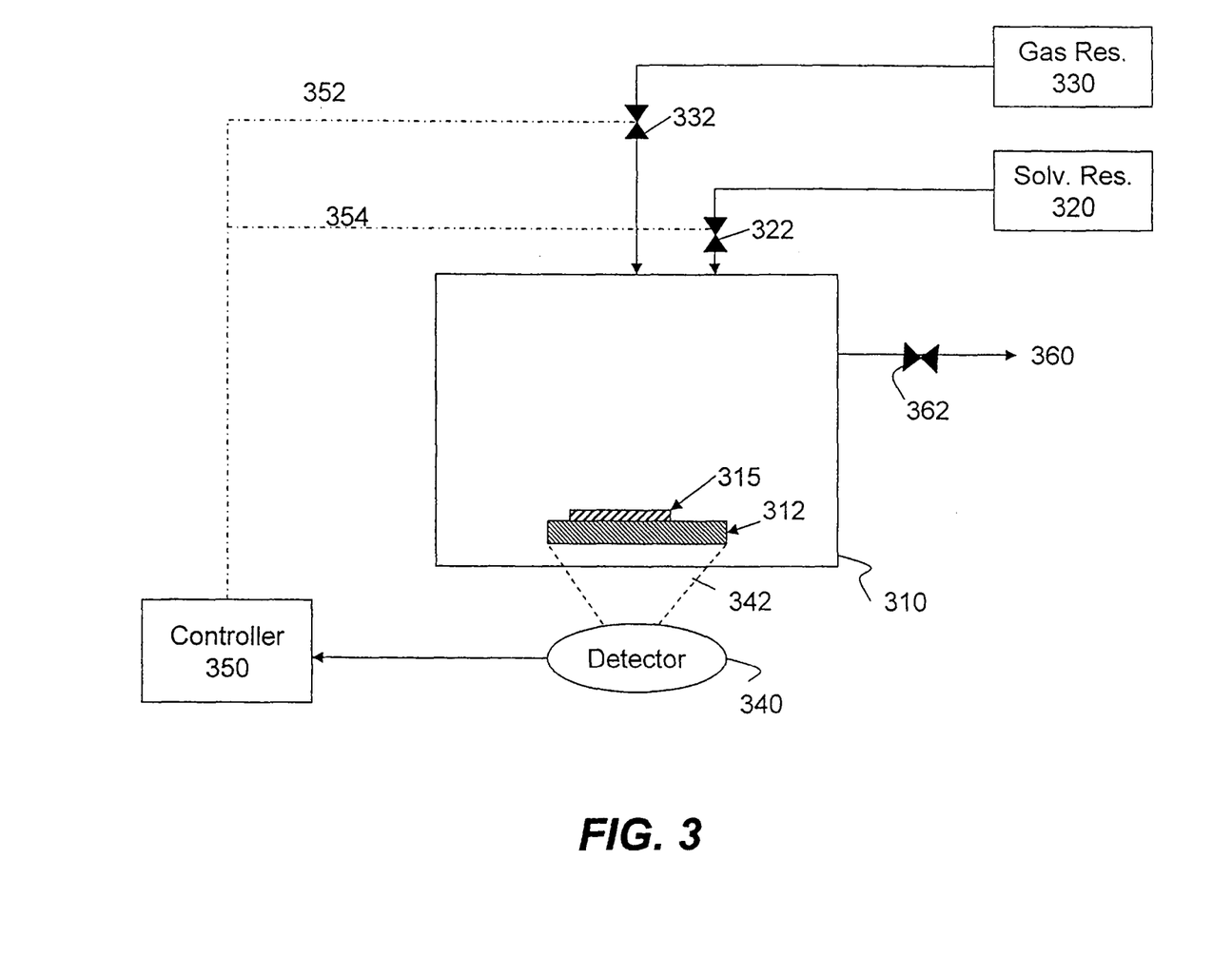
FIG. 3 shows an exemplary apparatus for post-deposition treatment of the printed polymer film.

FIG. 3 shows an exemplary apparatus for post-deposition treatment of the printed polymer film. In FIG. 3, chamber 310 contains substrate 312. Substrate 312 has polymer film 315 printed thereon. The polymer film comprises a plurality of polymer nanobeads. When substrate 312 is placed in chamber 310, the nanobeads form an opaque structure detectable by detector 340. Detector 340 can be a conventional optical detector configured to assess opacity of polymer film 315.

Detector 340 communicates with controller 350. Controller 350 can comprise a processor circuit (not shown) in communication with a memory circuit (not shown) and with detector 340. When receiving indicia of opacity from detector 340, controller 350 signals 354 valve 322 to open. Valve 322 communicates solvent vapor from solvent reservoir 320 to chamber 310. The solvent can be any material capable of lowering the glass transition temperature ($T_g$) of printed polymer film 315. For example, the solvent reservoir may contain one or more solvents including water, acetone, methyl ethyl ketene, toluene and alcohol. Reservoir 320 may alternatively contain vapor of such solvents. Depending on the application, the solvent may be organic or inorganic.

After controller 350 has opened valve 322 to expose printed polymer film 315 to solvent vapors, detector 340 may continue monitoring opacity of the film. Controller 350 may also open exhaust valve 362 to allow purging the excess vapor from chamber 310. As the opacity improves, the improvement is communicated to controller 350. Controller 350 can compare the opacity data with known or desired opacity data retained in its memory (not shown). The controller may slowly shutdown valve 322 to reduce entry of solvent vapors. Once the desired opacity for printed polymer film 315 is reached, controller 350 coordinates valves 322 and 332 (via signal 352) to terminate inlet of vapor solvent 320 and introduce drying gas 330 into chamber 310. Drying gas 320 can be any suitable gas for drying film 315. The drying gas can include nitrogen, argon, oxygen and helium and their mixtures.

Once the printed polymer film is sufficiently dry, the processor can shut off drying gas valve 332 and exhaust valve 362 and the substrate can be removed from chamber 310 to ambient 360. Detector 340 can conduct a quality control check by analyzing light signals 342 from substrate 312 to determine opacity of film 315.

MEMS Devices

As stated, an embodiment of the disclosure relates to a method and apparatus for devising MEMS structures. In a simplistic example of surface micromachining, there are two distinct layers: the structural and sacrificial layers. The structural layer includes materials that form the final structures and features while the sacrificial layer holds the structural layer in place during the micromachining process. Once the process is completed, and the structural layer is stable, the sacrificial layer is removed to release the structural layer's features. To avoid removing parts of the structure during the release step, the layers are typically of different materials. Because surface micromachining relies on material compatibility, it is important to identify sets of compatible materials before developing a process.

Conventional ink used for the structural layer is silver nanocrystalline metallic ink. The silver-based conductive contains 30 nm diameter nanocrystals suspended in an ethylene glycol/ethanol carrier fluid. The small particle size reduces the melting temperature of the nanocrystals. Generally, such films become conductive after sintering at 120° C. This is lower than bulk silver's melting point of 962° C. The low temperature processing is appealing because it allows for a wide variety of substrates, including plastic and flexible substrates to be used without damage. Nonetheless, the main concern with using the ink as the structural layer is the reduced conductivity and structural integrity. In fact, it has been observed that the sintered films exhibit ten times higher resistivity than bulk and electroplated films. Because the film now has reduced electrical properties, it follows that mechanical properties of the film suffer as well.

For sacrificial layer of the MEMS device, nanobeads of PMMA suspended in a water ink vehicle can be used. The ink can be formed from 300 nm diameter beads suspended in surfactant and water. In a preferred embodiment, a suspension of 80 nm beads in surfactant and water can be used. The surfactant is used to stabilize the bead suspension and prevent the beads from precipitating out of solution. PMMA nanobeads are thermally compatible with the silver nanocrystals. A disadvantage of the PMMA nanobeads is the shape of the nanobeads. As discussed, the morphology of the nanobeads can be treated with a post-processing step.

To obtain uniform film coverage, the substrate's surface energy needs to be uniform and clean. This is because ink wettability is dictated by the substrate's surface energy. Slight changes in surface energy causes the ink to bead up and avoid the less energy-favorable regions. The primary causes for surface energy non-uniformity are foreign contaminants and debris.

Figure 4:
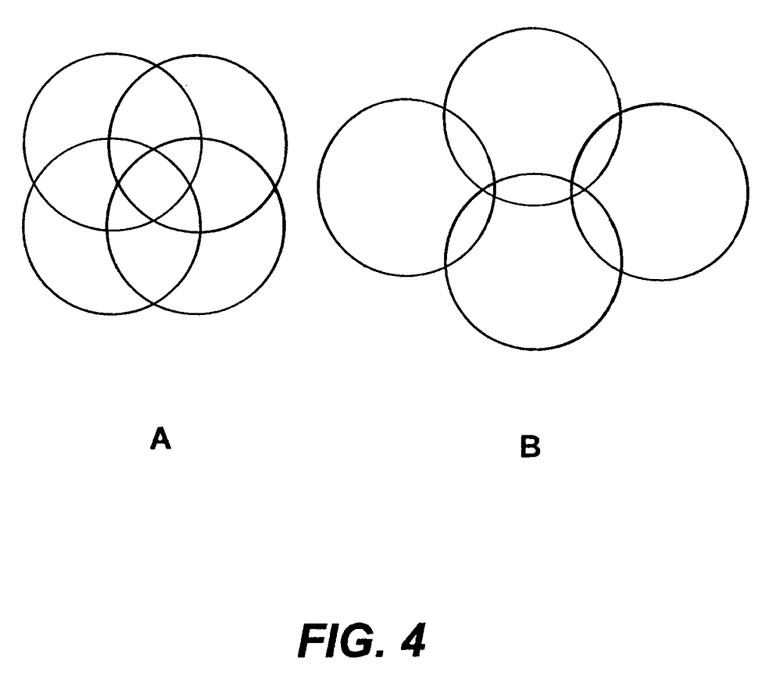
FIG. 4A shows an overlapping printing pattern.
FIG. 4B shows a rectangular printing pattern.

In addition, the PMMA ink must be deposited in a manner to minimize post-treatment. FIG. 4A shows an overlapping printing pattern and FIG. 4B shows a rectangular printing pattern. The packing format of PMMA nanobeads in FIG. 4A is inefficient and causes significant variation in film thickness. The format of FIG. 4A may also require substantial post-deposition treatment. On the other hand, FIG. 4B shows a hexagonal pattern which advantageously provides less overlap and more coverage. The deposition pattern of FIG. 4B requires less post processing to obtain a smooth, uniform film.

Another optimization step may include baking the substrate and the deposited film before and after the smoothing process. Because the PMMA films retain residual solvent and moisture, the time required for smoothing the films may be inconsistent. To ensure consistency, in one experimental model, the films were placed on 100° C. hotplates to drive out any residual solvent and moisture. The post-bake step can also be added to the process to remove all of the solvent and provide a definite stop to the PMMA reflow. In a preferred embodiment, PMMA is subjected to solvent vapor treatment. The solvent vapor treatment causes PMMA to reflow at room temperature to provide the desired morphological consistency.

The following experiments were conducted to show the advantages of cold reflow according to the principles of the invention.

Experiment 1

An experiment was devised to study the effectiveness of using inkjet printing method together with solvent vapor post-treatment to form smooth PMMA features. Namely, a smooth PMMA spacer and structure layers for MEMS surface micromachining application were devised by inkjet printing aqueous PMMA nanosphere suspensions and solvent annealing nanobead structures in Acetone.

The starting ink comprised of PMMA nanobead-water binary mixture and was prepared by stirring PMMA nanobeads (surface pretreated with surfactant to increase stability of the mixture) in de-ionized water for 2 hours. The final mixture was filtered through a 5 um polytetrafluoroethylene (PTFE) filter. Microscopic slides were used as substrate. Before use, the glass substrates were degreased by ultrasonification in 2% Micro-90 solution, de-ionized water and boiling isopropanol each for 5 minutes and then dried with nitrogen gas. Ink containing different PMMA loading concentrations were printed onto clean glass substrates with a Hewlett-Packard DOD type thermal Inkjet printer, which is compatible with aqueous and a number of non-aqueous fluids. The printing system also included a moving stage for accommodating substrates of 1 inch×1 inch size, and a video camera to capture in situ image of ink droplets landing on the substrate. PMMA patterns were defined by moving the substrate with respect to the printhead at a position accuracy of 2 µm.

After inkjet printing, the samples were placed in a 150 mL wide-mouth glass jar, mounted face-up, about 1 cm above the liquid level of 20 mL acetone. The glass jar was used as a chamber for exposing the printed polymer to solvent vapors. The container was then sealed with a Teflon-lined cap to expose the PMMA samples to consistent acetone vapors. The exposure time varied from a few minutes to dozens of minutes. At the end of the solvent vapor exposure step, the samples were immediately taken out of the container and blown dry in nitrogen gas to remove any acetone residual.

It was observed that the initial surface roughness was reduced from greater than 10 micron to less than 1 micron, by exposing the pattern to volatile organic solvent acetone for less than 20 minutes. Acetone vapor diffused into the nanobead structure, effectively lowering the glass transition temperature of nanobeads below the room temperature. During solvent exposure, PMMA beads fused together and formed a continuous film.

Figure 5A:
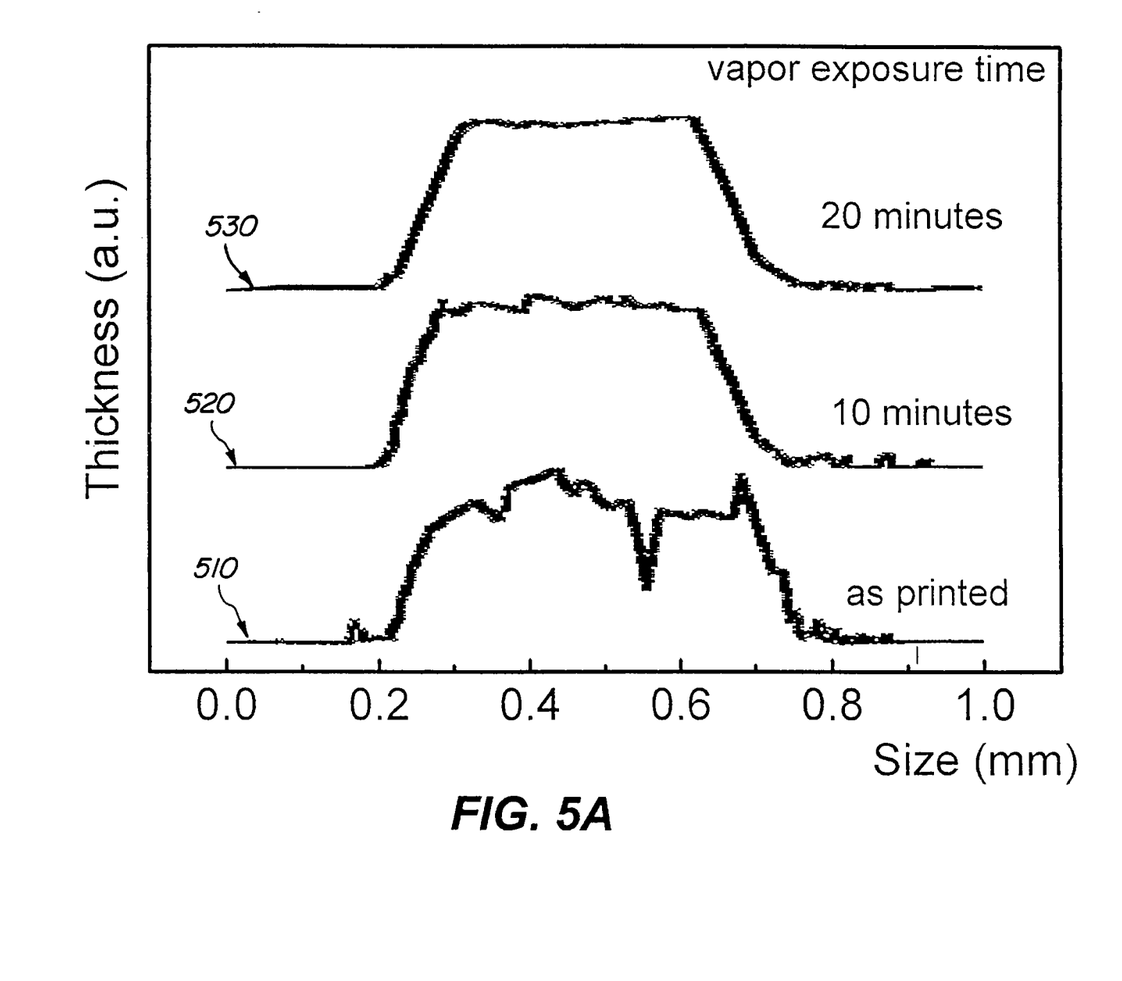
FIG. 5A shows the cross-sectional thickness of a printed PMMA nanobeads as smoothened in Experiment 1.
Figure 5B:
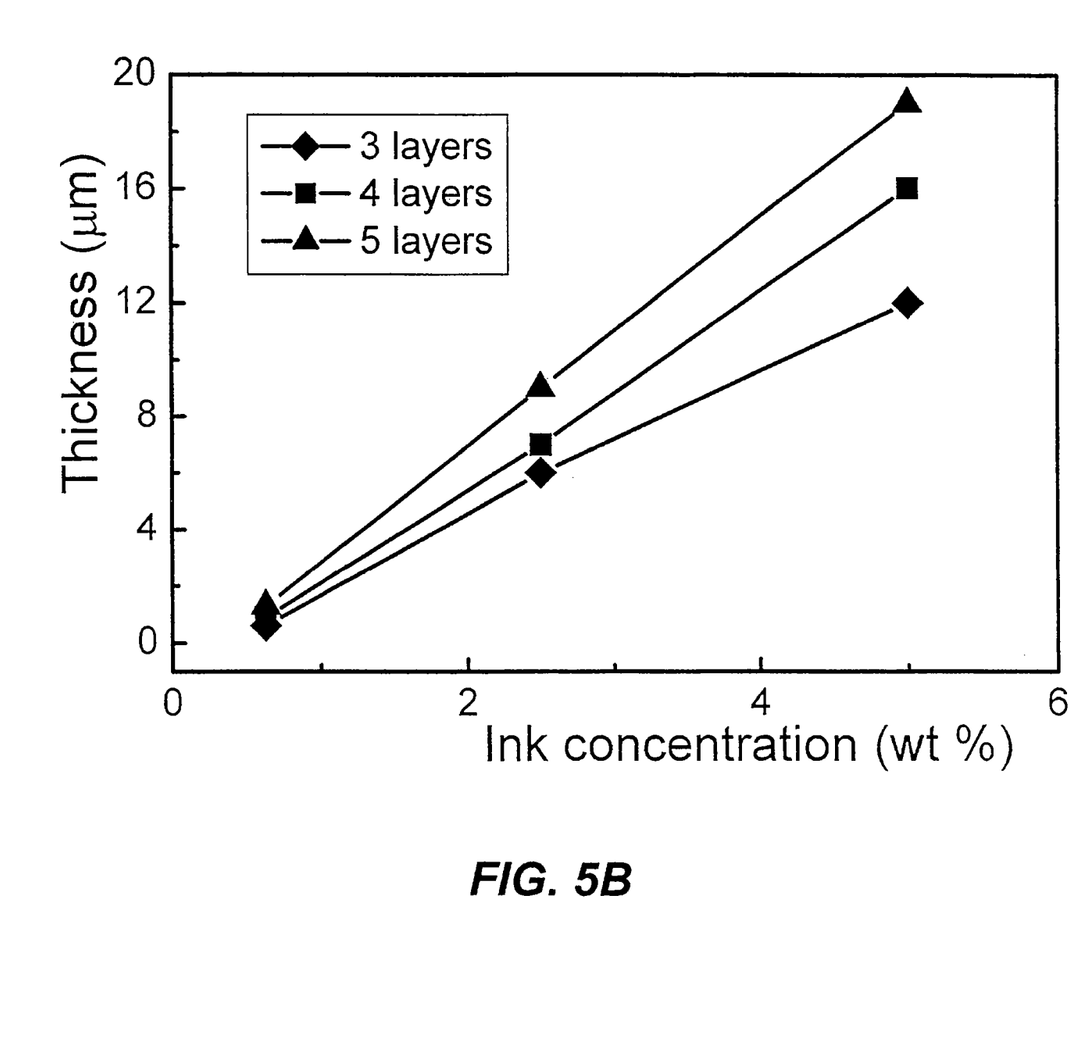
FIG. 5B shows the relationship between ink concentration and thickness of PMMA films.

FIGS. 5A and 5B illustrate the results of the experiment. Specifically, FIG. 5A shows the cross-section of a printed square pattern with PMMA nanobeads, and the morphological changes. During the vapor annealing experiment, the initial surface roughness was completely smoothed out by exposing the pattern to volatile organic solvent, such as acetone. Acetone vapor diffused into the nanobead structure, effectively lowering the glass transition temperature of nanobeads below the room temperature. During solvent exposure, PMMA beads fused together and formed a continuous feature. In FIG. 5A, profile 510 shows the surface roughness of the PMMA film when printed. Profile 520 shows the surface roughness of the PMMA film after 10 minutes of exposure to solvent vapor and profile 530 shoes the surface roughness of the PMMA film after 20 minutes of exposure to solvent vapor.

FIG. 5B shows the relation between the PMMA ink concentration, the number of printed layers and the thickness of the final printed structures of Experiment 1. A linear relation is observed in this figure, which clearly indicates that thicker PMMA films can be obtained by printing multiplicity of PMMA layers followed by solvent treatment.

Experiment 2

A MEMS structure was devised with the structural and sacrificial materials separately optimized. The two structures were combined together to complete the surface micromachining process. In theory, the process can consist of three stages: depositing and processing of the sacrificial material, depositing and processing of the structural material, and removal of the sacrificial material. In practice, however, the process is more complicated because of the difficulty with confining the amount of ink needed to obtain 1 μm thick structural film. The large volume would overcome the ink's surface tension and subsequently spill out to the surrounding area, resulting in a thinner and poorer defined film. To counteract this, external mechanisms are needed to keep the silver ink confined during the drying and densification steps.

In an embodiment of the disclosure, silver ink is confined by depositing secondary PMMA features. These secondary features act as barriers or dams essentially creating a mold to contain the silver ink during sintering. An advantage to the secondary structure is that it can be removed at the same time as the sacrificial layer during the release step. These secondary features can be deposited in the same fashion as the sacrificial layer, but do not require an optimized smoothing step because the barrier's smoothness and uniformity are less critical.

Figure 6:
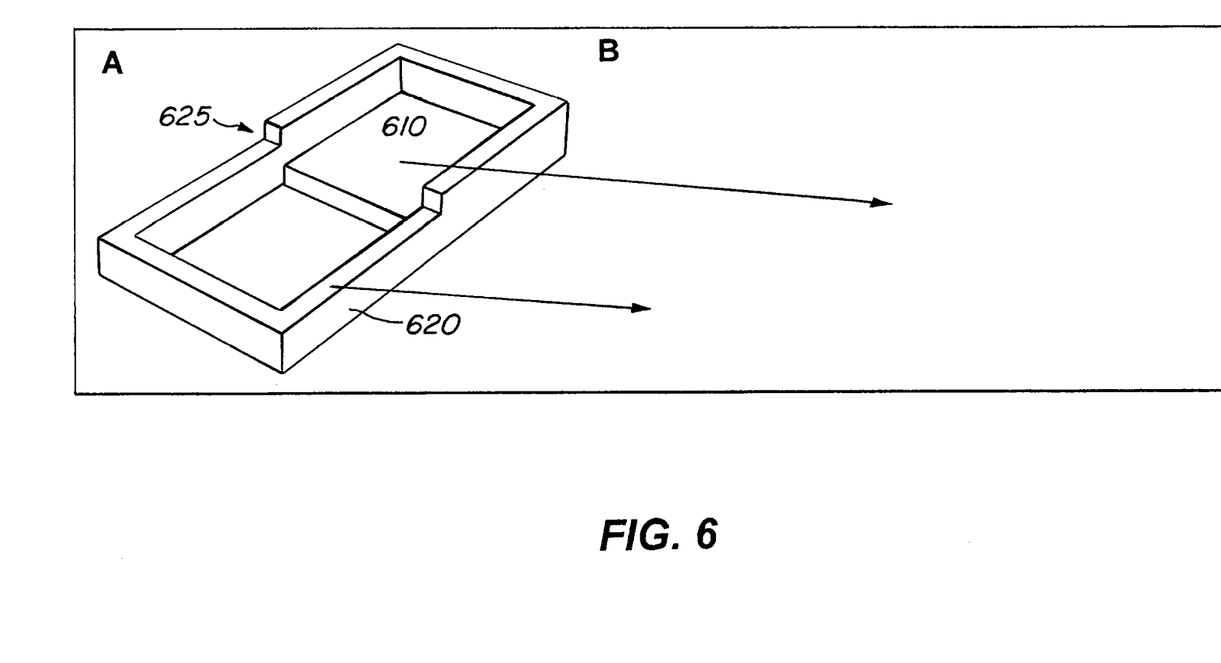
FIG. 6A illustrates a PMMA cantilever mold prepared according to one embodiment of the disclosure.
FIG. 6B provides an optical micrograph of the PMMA cantilever mold of FIG. 6A.

FIG. 6 illustrates a PMMA cantilever mold prepared according to one embodiment of the disclosure. In order to constrain the silver ink, PMMA film is deposited in the shape shown in the dam structure of FIG. 6 following the steps illustrated in Experiment 1. The shape effectively acts as a mold. While the substrate was heated to 40° C., the sacrificial layer was deposited first by printing 3 layers in a hexagonal pattern (see, e.g., FIG. 4B) assuming a droplet diameter of about 120 μm. This was followed by a 5 minute bake on a 100° C. hotplate to expel any residual fluid. Next, the structure and the substrate were placed in a sealed chamber and suspended over 10 mL of acetone to perform the solvent vapor smoothing for about 8 minutes. Following the vapor smoothing step, the devices were baked once again for 5 minutes on the 100° C. hotplate to drive off any remaining solvent vapor and halt the smoothing process. With the sacrificial layer 610 defined, the PMMA barriers 620 was deposited. The substrate was once again heated to 40° C. and a 10 layer PMMA film with 25 μm pitch 425 was printed in the cantilever shape.

The vapor smoothing process was repeated, this time subjecting the printed PMMA film to acetone vapor for about 3 minutes to ensure that the PMMA barrier is continuous but not necessarily smooth. A top view optical micrograph of the resulting PMMA cantilever mold is shown in FIG. 6B.

The structural layer was deposited to fill the PMMA molds with silver ink. Even though the silver ink only needed to fill the molds, the ink is still jetted via a 35 pL nozzle to control precisely where the silver is deposited. This accurate deposition was intended to prevent the silver from spilling over the barriers. While the PMMA layer acts as a physical barrier, the primary mechanism for containing the silver ink is its poor wettability or its surface tension. This allows the PMMA barriers to be shorter because the silver ink will pool up significantly higher than the PMMA barriers. After depositing the silver ink layers into the PMMA dams, the devices were placed in the tube furnace for sintering.

To prevent oxidation, a constant nitrogen flow was introduced so that the silver film is sintered in a nitrogen environment. The furnace was ramped to 250° C. at 1.5° C./minute, where it sintered for 30 minutes and then it was ramped down room temperature at 1.5° C./minute. The devices were slowly ramped up and down to avoid cracking the silver film.

Figure 7:
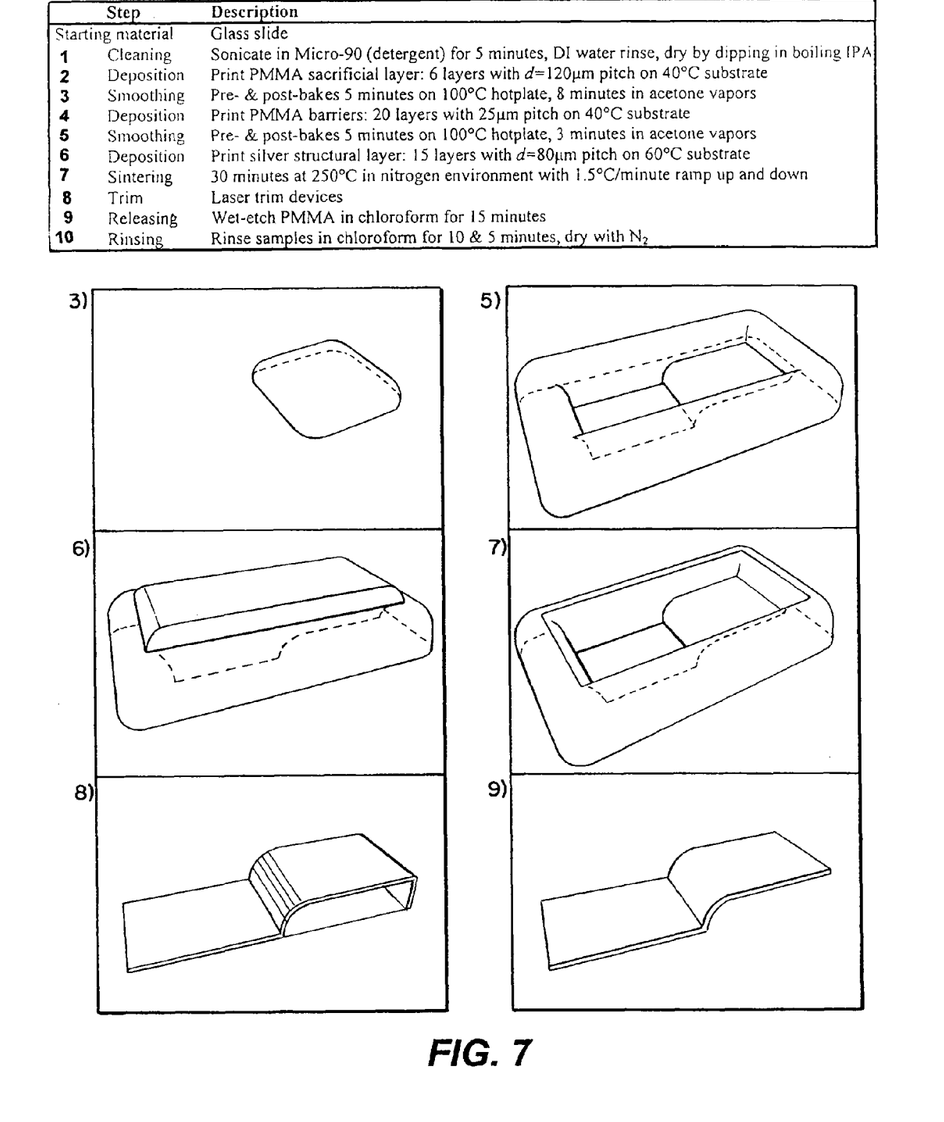
FIG. 7 summarizes the steps used in forming the cantilever structure of Experiment 2.

Removing the sacrificial layer to release the cantilevers was done via wet etching by submersing the devices into chloroform. Wet etching was chosen over dry methods such as pyrolysizing or oxygen plasma etching; namely, pyrolysizing requires temperatures even higher than sintering the silver and oxygen plasma etching oxidizes the silver film, drastically changing the mechanical characteristics of the device. The devices were submerged into the first bath of chloroform for 15 minutes to remove the PMMA mold. Subsequent baths for chloroform for 10 and 5 minutes were used to ensure the PMMA and miscellaneous debris was removed. FIG. 7 summarizes the steps used in forming the cantilever structure of Experiment 2.

It should be noted that while the inventive principles described herein are discussed with reference to inkjet printing techniques and apparatus, the disclosed principles apply equally to other forms of printing including lithographic and laser printing. Further, while the principles of the disclosure have been illustrated in relation to specific exemplary illustrations, the principles of the disclosure are not limited thereto and include any modification, variation or permutation thereof.

What is claimed is:

1. A process for improving optical property of a printed film, the process comprising:
   inkjet printing a film on a substrate, the printed film having polymer nanobeads which form an opaque initial surface area on the substrate;
   reflowing the nanobeads by exposing the nanobeads to a solvent vapor for a period of time at ambient temperature and pressure to form a solvent vapor exposed film; and
   drying the solvent vapor exposed film to provide a transparent film;
   wherein a melting temperature of the solvent is substantially less than the melting temperature of the at least one polymer; and
   wherein the dried film has a surface area substantially identical to initial surface area.

2. The process of claim 1, wherein each polymer nanobead is deposited spatially apart from an adjacent nanobead.

3. The process of claim 1, wherein the step of exposing the printed film to solvent vapor further comprises exposing the printed film to the solvent vapor for a duration of time to reduce glass transition temperature of the printed film to a temperature less than the ambient temperature.

4. The process of claim 1, wherein the step of exposing the printed film to solvent vapor further comprises exposing the printed film for a duration of time required to cause a reflow of the printed film.

5. The process of claim 1, wherein the solvent vapor is selected from the group consisting of water, acetone, methyl ethyl ketone, toluene and alcohol.

6. A method for controlling optical properties of a deposited film, the method comprising:
   inkjet printing a film on a substrate, the printed film including a polymer pigment in a carrier fluid;
   evaporating the carrier fluid to form a dried opaque polymer film on the substrate, the dried polymer film having polymer nanobeads;

reflowing the polymer nanobeads by exposing the nanobeads to a solvent vapor at ambient temperature and pressure to thereby reduce a glass transition temperature of the polymer film; and controlling the optical properties of the polymer film by controlling a reflow duration of the printed film to form a transparent polymer film relative to the opaque polymer film.

7. The method of claim 6, wherein the dried polymer film defines an initial printed surface on the substrate substantially identical to the reflown film.

8. The method of claim 6, wherein the glass transition temperature of the film is reduced to less than the ambient temperature.

9. The method of claim 6, further comprising an optical control system for testing the optical properties of the polymer film during the reflowing step.

10. The method of claim 9, wherein the optical control system reduces or increases the glass transition temperature of the polymer film to attain a desired optical property.

11. The method of claim 6, wherein the step of reflowing the dried polymer film further comprises exposing the dried polymer film to a solvent vapor selected from the group consisting of water, acetone, methyl ethyl Ketone, toluene and alcohol.

12. The method of claim 6, wherein the substrate comprises glass.

* * * * *